(12) United States Patent
Qiao et al.

(10) Patent No.: US 10,043,844 B2
(45) Date of Patent: Aug. 7, 2018

(54) SYSTEM, METHOD, AND APPARATUS FOR GENERATING A RAMP SIGNAL WITH A CHANGING SLOPE

(71) Applicant: Cista System Corp., Grand Cayman (KY)

(72) Inventors: Wenhao Qiao, Milpitas, CA (US); Guangbin Zhang, Cupertino, CA (US); Dennis Tunglin Lee, San Jose, CA (US)

(73) Assignee: Cista System Corp., Grand Cayman (KY)

( * ) Notice: Subject to any disclaimer, the term of this patent is extended or adjusted under 35 U.S.C. 154(b) by 188 days.

(21) Appl. No.: 15/211,936

(22) Filed: Jul. 15, 2016

(65) Prior Publication Data

US 2017/0018593 A1    Jan. 19, 2017

Related U.S. Application Data

(60) Provisional application No. 62/194,213, filed on Jul. 18, 2015.

(51) Int. Cl.
| | |
|---|---|
| *H03M 1/58* | (2006.01) |
| *H01L 27/146* | (2006.01) |
| *H03K 4/08* | (2006.01) |
| *H03L 7/197* | (2006.01) |
| *H03M 3/00* | (2006.01) |
| *H03K 6/04* | (2006.01) |

(52) U.S. Cl.
CPC .. *H01L 27/14643* (2013.01); *H01L 27/14609* (2013.01); *H03K 4/08* (2013.01); *H03K 6/04* (2013.01); *H03L 7/1976* (2013.01); *H03M 3/30* (2013.01)

(58) Field of Classification Search
CPC .............. H03M 3/30; H01L 27/14643; H01L 27/14609; H03K 4/08; H03K 6/04; H03L 7/1976
USPC ................................. 341/155, 164, 169, 170
See application file for complete search history.

(56) References Cited

U.S. PATENT DOCUMENTS

| | | | | |
|---|---|---|---|---|
| 8,264,580 B2 * | 9/2012 | Mori | ...................... | H04N 3/155 348/248 |
| 8,606,051 B2 * | 12/2013 | Wang | .................. | H03M 1/1009 341/126 |
| 8,941,045 B2 * | 1/2015 | Okura | ..................... | H03M 1/00 250/208.1 |

* cited by examiner

*Primary Examiner* — Khai M Nguyen
(74) *Attorney, Agent, or Firm* — Sheppard, Mullin, Richter & Hampton LLP

(57) ABSTRACT

A device for generating a ramp signal with a changing slope is disclosed. The device may comprise a processor configured to generate a variable signal. The device may also comprise a phase-locked loop (PLL) circuit configured to receive the variable signal and a reference clock signal, generate a changing ramp clock signal based on the variable signal and the reference clock signal, and output the generated changing ramp clock signal as an input of an analog-to-digital-converter (ADC) circuit.

25 Claims, 6 Drawing Sheets

SYSTEM, METHOD, AND APPARATUS FOR GENERATING A RAMP SIGNAL WITH A CHANGING SLOPE

CROSS REFERENCE TO RELATED APPLICATION

The present application is based on and claims the benefit of priority to U.S. Provisional Application No. 62/194,213, filed Jul. 18, 2015, the entire contents of which are incorporated herein by reference.

TECHNICAL FIELD

The present application relates to the technical field of solid state integrated circuit design, and more particularly, to complementary metal-oxide-semiconductor (CMOS) image sensing.

BACKGROUND

Digital cameras, scanners, and other imaging devices often use image sensors, such as charge-coupled device (CCD) image sensors or complementary CMOS image sensors, to convert optical signals to electrical signals. An image sensor typically includes a grid of pixels, row access circuitry, column access circuitry, and a ramp signal generator. The pixels capture the light impinged on them and convert the light signals to electrical signals. The row access circuitry controls which row of pixels that the sensor will read. The column access circuitry includes column read circuits that read the signals from corresponding columns. The ramp signal generator generates a ramping signal as a global reference signal for column read circuits to record the converted electrical signal. In operation, the quality of the ramping signal can significantly affect the quality of the output of the image sensor.

In conventional CMOS Image sensing, a ramp voltage wave signal ("vramp signal") is used as the global reference for an Analog-to-Digital Converter (ADC) circuit. In this case, vramp usually ramps up linearly before quickly dropping to zero and repeats this cycle. Such ADC is known as Ramp-ADC (or Ramp-Compare-ADC), which can convert analog signals from photodiode pixels into digital codes. The ramp time of the vramp signal travelling across the photodiode signal is correlated with the light strength. For a positive ramp, a ramp crossing time is shorter in weak light areas, and longer in strong light areas. The least significant bit (LSB) voltage of a Ramp-ADC is unchangeable in both weak light areas and strong light areas because of the linearity of vramp signals. The dynamic range (DR) of image sensors is limited by a resolution of a Ramp-ADC, $DR=FSR/LSB=2^N=6.02N$ (dB), where FSR is a full-scale rage or the maximum value of the input voltage of the Ramp-ADC, and LSB is the minimum input that the ADC can sense, also known as the resolution of the ADC. Thus, DR can represent a range of signal amplitudes which the ADC can resolve. To improve the sensor performance by increasing DR, FSR can be increased or LSB can be decreased.

Current extended dynamic range or high dynamic range (HDR) image sensors often use the multi-exposure technology or extend the ADC bits. With regard to the multi-exposure technology, the sensors capture several pictures with different exposure times. A backend software or an image signal processor (ISP) merges all the captured pictures together to generate a HDR picture. This technology has at least three drawbacks. The first drawback is having a low picture clarity. Because these pictures with different exposure times are taken at different time points, both the target and the camera may be shifted. The merged picture can be unclear. The second drawback is having a low speed. Merging several high resolution pictures together needs a long computing time. The third drawback is having a high cost. To merge several high resolution pictures, a sophisticated software or ISP is needed. A fast temporary memory is required to save raw picture data. Thus, the system cost can be too high to get a fast frame rate and high resolution HDR pictures. With regard to the ADC bits-extending technology, sensor frame rate may be adversely affected. For example, if the bits number of ADC increases from 10 bits to 12 bits, the sensor will need four times of ramping time, and the speed becomes a limitation. The disclosed systems and methods may mitigate or overcome one or more of the problems set forth above and/or other problems in the prior art.

SUMMARY

One aspect of the present disclosure is directed to a device for generating a ramp signal with a changing slope is disclosed. The device may comprise a processor configured to generate a variable signal. The device may also comprise a phase-locked loop (PLL) circuit configured to receive the variable signal and a reference clock signal, generate a changing ramp clock signal based on the variable signal and the reference clock signal, and output the generated changing ramp clock signal as an input of an analog-to-digital-converter (ADC) circuit.

Another aspect of the present disclosure is directed to a method for generating a ramp signal with a changing slope. The method may comprise generating, by a processor, a variable signal; receiving, by a phase-locked loop (PLL) circuit, the variable signal and a reference clock signal; generating, by the PLL circuit, a changing ramp clock signal based on the variable signal and the reference clock signal; and outputting, by the PLL circuit, the generated changing ramp clock signal as an input of an analog-to-digital-converter (ADC) circuit.

Another aspect of the present disclosure is directed to a sensor system for generating a ramp signal with a changing slope. The sensor system may comprise a photodiode array configured to convert a light signal to an electric signal, a phase-locked loop (PLL) circuit, and an analog-to-digital-converter (ADC) circuit. The PLL circuit may be configured to receive a variable signal and a reference clock signal, and generate a changing ramp clock signal based on the variable signal and the reference clock signal. The ADC circuit may be configured to measure the light signal by comparing the generated changing ramp clock signal and the electric signal.

Additional features and advantages of the present disclosure will be set forth in part in the following detailed description, and in part will be obvious from the description, or may be learned by practice of the present disclosure. The features and advantages of the present disclosure will be realized and attained by means of the elements and combinations particularly pointed out in the appended claims.

It is to be understood that the foregoing general description and the following detailed description are exemplary and explanatory only, and are not restrictive of the invention, as claimed.

BRIEF DESCRIPTION OF THE DRAWINGS

The accompanying drawings, which constitute a part of this specification, illustrate several embodiments and, together with the description, serve to explain the disclosed principles

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present disclosure do not represent all implementations. Instead, they are merely examples of systems and methods consistent with aspects related to the invention as recited in the appended claims.

Figure 1:
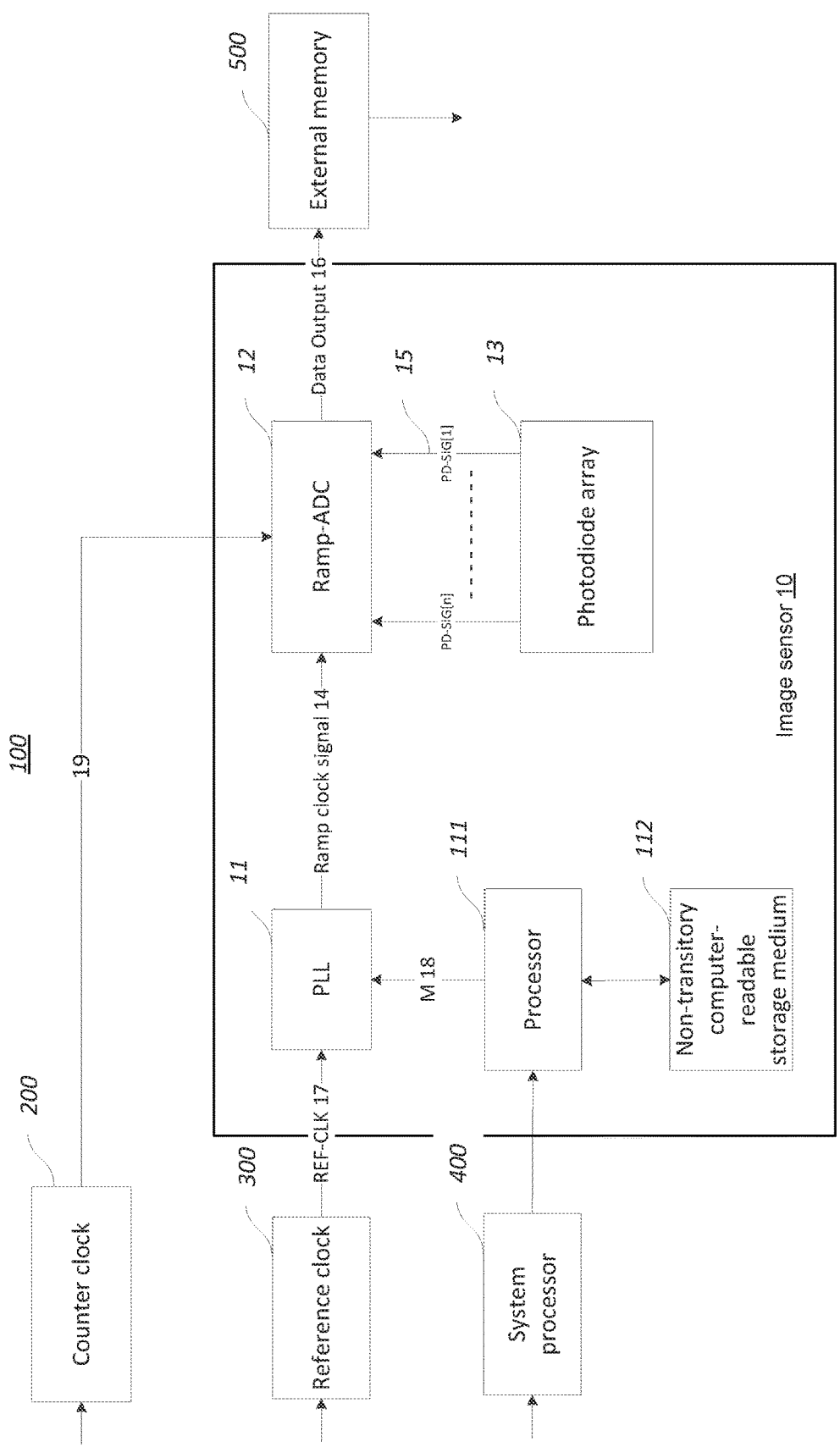
FIG. 1 is a high-level block diagram illustrating an image sensor in an image system for generating a changing ramp clock signal, consistent with exemplary embodiments of the present disclosure.

FIG. 1 is a high-level block diagram of a readout structure illustrating an image sensor 10 in a sensor system 100 for generating a changing ramp clock signal, consistent with exemplary embodiments of the present disclosure. System 100 may be a part of a sensor system such as a camera system. System 100 and image sensor 10 may comprise a number of components, some of which may be optional. In practice, any component of system 100 may also be connected to one or more other input or output channels not shown in figures of this disclosure.

In some embodiments, system 100 may comprise a counter clock 200, a reference clock 300, a system processor 400, and an external memory 500, each of which connects to image sensor 10. Image sensor 10 may receive inputs from counter clock 200, reference clock 300, and system processor 400, and may output to external memory 500. Image sensor 10 may be a CMOS image sensor.

In some embodiments, image sensor 10 may comprise a photodiode array 13, a ramp-ADC 12, a PLL 11, a processor 111, and a non-transitory computer-readable storage medium 112. Photodiode array 13 may sense light signals as inputs and convert the light signals to voltage signals 15: PD-SIG[n:1] with 'n' bits parallel signals for a fast readout speed. Thus, a voltage level of voltage signals 15 may be related to the input signal: light strength in the environment. Signals disclosed in this disclosure may be non-transitory. Outputs of photodiode array 13 may be transmitted to ramp-ADC 12 through multiple output channels.

PLL 11 may receive a reference clock signal (REF-CLK) 17 from reference clock 300 and a PLL divider control signal (M) 18 from processor 111. Processor 111 may communicate with system processor 400 and non-transitory computer-readable storage medium 112. In some embodiments, processor 111 and system processor 400 may be integrated together at system level. Non-transitory computer-readable storage medium 112 may also be a part of a system-level memory.

In some embodiments, non-transitory computer-readable storage medium 112 may store instructions comprising a special signal or signal pattern embodying signal M. Signal M may have a variable pattern. For example, the signal pattern may include a monotonically increasing pattern, cycles of a monotonically increasing pattern, cycles of a monotonically decreasing pattern, or patterns of non-monotonic functions. The instructions, when executed by processor 111, may cause processor 111 to control PLL 11 to generate a changeable ramp clock signal 14 and transmit the ramp clock signal to ramp-ADC 12. The frequency of ramp clock signal 14 can be increased or decreased, linearly or non-linearly, depending on a requirement of a ramp curve and/or applications, as described in details below. For illustration purposes, this disclosure is mainly based on a positively accelerating ramp. PLL 11 is described in more details below with reference to FIG. 2.

Ramp-ADC 12 may receive ramp clock signal 14, voltage signals 15, and an optional counter clock signal (EX-CNT-CLK) 19 from counter clock 200. Ramp-ADC 12 may convert analog domain voltage signals 15 into digital domain data output 16, and may transmit data output 16 to external memory 500. Ramp-ADC 12 is described in more details below with reference to FIG. 3.

Figure 2:
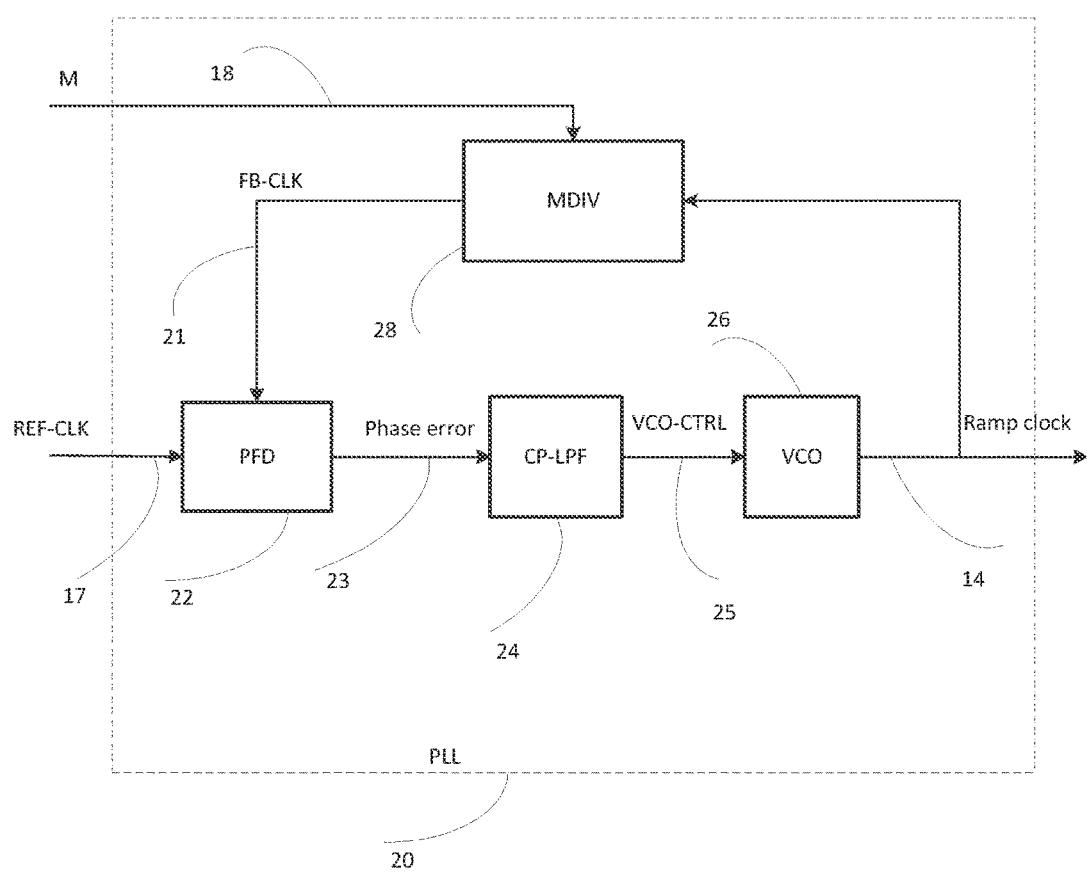
FIG. 2 is a block diagram illustrating a PLL circuit in the image system, consistent with exemplary embodiments of the present disclosure.

FIG. 2 is a block diagram 20 illustrating PLL 11, consistent with exemplary embodiments of the present disclosure. PLL 11 may comprise a number of components, some of which may be optional.

In some embodiments, PLL 11 may comprise a Phase-Frequency Detector (PFD) 22, a charge-pump with a low pass filter (CP-LPF) 24, a voltage-controlled oscillator (VCO) 26, and a frequency divider (MDIV) 28. PFD 22 may connect to MDIV 28 and CP-LPF 24. CP-LPF may connect to PFD 22 and VCO 26. VCO 26 may connect to CP-LPF 24 and MDIV 28.

In some embodiments, PFD 22 may receive a feedback clock signal (FB-CLK) 21 from MDIV 28 and receive REF-CLK 17 from reference clock 300. PFD 22 may determine a frequency error between REF-CLK 17 and FB-CLK 21 according to a comparison of the phases of input signals. In some embodiments, if the frequency of FB-CLK 21 is smaller than the frequency of REF-CLK 17, PFD 22 may generate a positive phase error signal 23. PFD may transmit the phase error to CP-LPF 24.

In some embodiments, CP-LPF 24 may receive the phase error and integrate the signal to smooth it. CP-LPF 24 may transfer the voltage signal of phase error signal 23 to positive or negative charges, accumulate charges, and filter high frequency components from phase error signal 23. Thus, CP-LPF 24 may output a smooth signal of voltage-controlled oscillator control signal (VCO-CTRL) 25 to VCO 26, while the oscillation frequency of VCO 26 may depend on VCO-CTRL 25.

In some embodiments, VCO 26 may receive VCO-CTRL 25 and output a ramp clock signal 14 as a clock output. VCO 26 may output ramp clock signal 14 to MDIV 28 and/or ramp-ADC 12.

In some embodiments, MDIV 28 may receive ramp clock signal 14 from VCO 26 and signal M 18 from processor 111, and may output a clock frequency that is 1/M of an input clock frequency, e.g., FB-CLK 21 which is 1/M of ramp clock signal 14 as expressed in the following representation, with f( ) representing a frequency of a variable:

$$f(\text{FB-CLK 21}) = f(\text{ramp clock signal 14})/M$$

In some embodiments, positive phase error signal 23 can accelerate the oscillation speed of VCO 26 to make the frequency error smaller and smaller. When the frequency of REF-CLK 17 and the frequency of FB-CLK 21 are the same, PLL 11 is locked. In a locked condition, the frequency of ramp clock signal 14 is M times of the frequency of REF-CLK 17, as expressed in the following representation:

$$f(\text{ramp clock signal 14}) = M*f(\text{REF-CLK 17})$$

In some embodiments, if the divider number M 18 for MDIV 28 is changed, the frequency of ramp clock signal 14 may change accordingly. In one example of acceleration, M 18 is increased, and accordingly, ramp clock signal 14 is increased. In some embodiments, signal M 18 has a cyclic pattern and also has a varying pattern in each cycle, e.g., a positive rate of increase in each cycle, causing the generated ramp clock signal 14 to be cyclic, and have a positive rate of increase in each cycle. In some embodiments, the ramp clock signal 14 can be nonlinearly increasing in each cycle. The cycles of the generated ramp clock signal 14 may be measured with respect to time, and the value of the generated ramp clock signal 14 may be measured in frequency, voltage, or other parameters. The generated changing ramp clock signal 14 may also be referred to as a slope-changing ramp signal in this disclosure. In some embodiments, signal M 18 may have a cyclic pattern and may also vary in value in each cycle. In other words, M 18 may be a variable signal in each cycle. An exemplary signal M 18 is: 2, 4, 8, 2, 4, 8, 2, 4, 8, . . . . In some embodiments, a time stamp when M 18 changes can be recorded as time A, a time stamp when ramp clock signal 14 changes and PLL locks again can be recorded as time B, and the delay time from time A to time B can be called PLL lock time. The PLL lock time may allow the frequency of ramp clock signal 14 to change smoothly. In some embodiments, the PLL lock time can be determined by a PLL loop bandwidth. The PLL loop bandwidth may be related to CP-LPF 24. By selecting suitable parameters, such as capacitance and/or resistance of CP-LPF 24, the bandwidth of CP-LPF 24 can be tuned and a frequency changeable ramp clock signal 14 can be generated. In some embodiments, the generated changing ramp clock signal can be configured to ramp up from a small signal to a large signal, or ramp down from a large signal to a small signal. A person having ordinary skill in the art should understand that such embodiments are conveyed by this disclosure. The CP-LPF may be pre-configured to determine a loop bandwidth of the PLL, the loop bandwidth determining a lock time of PLL that allows ramp clock signal 14 to change smoothly.

In some embodiments, the clock signal can be generated by a fractional PLL with a Sigma-Delta modulator. The frequency curve generated by a fractional PLL may be smoother than that generated by an integer PLL. The PLL illustrated in FIG. 2 may be an exemplary integer PLL.

In some embodiments, since the slope of a vramp signal is controlled by a ramp clock frequency, e.g., ramp clock 14, a frequency-changeable clock generator may be used to change the slope. For example, a PLL can be designed to generate a frequency changeable clock signal.

An exemplary ramp clock signal 14 is illustrated below with respect to FIG. 4.

Figure 3:
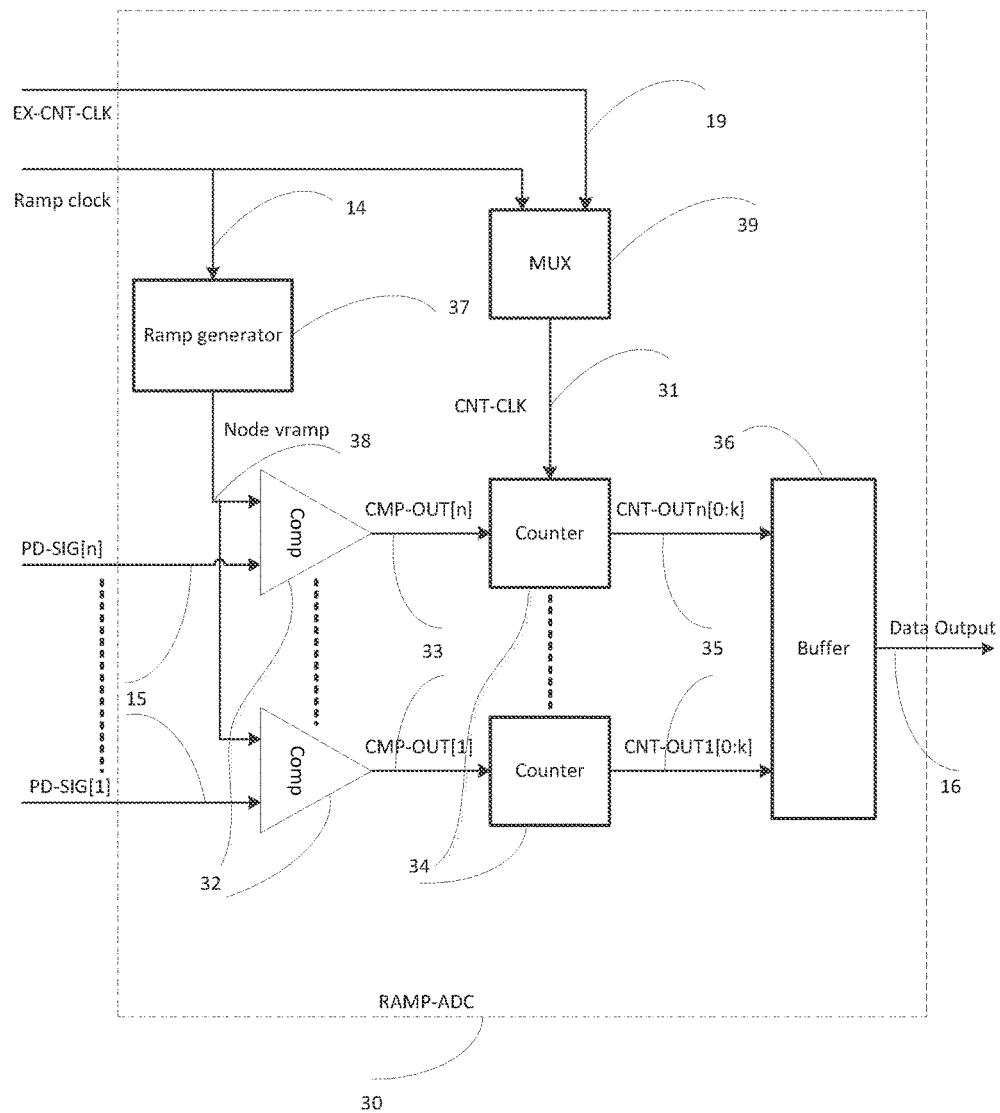
FIG. 3 is a block diagram illustrating a Ramp-ADC circuit in the image system, consistent with exemplary embodiments of the present disclosure.

FIG. 3 is a block diagram 30 illustrating Ramp-ADC 12, consistent with exemplary embodiments of the present disclosure. Ramp-ADC 12 may comprise a number of components, some of which may be optional.

In some embodiments, ramp-ADC 12 may comprise a ramp generator 37, one or more comparators (comps) 32, one or more counters 34, a buffer 36, and a 2-to-1 multiplexer (MUX) 39. Ramp generator 37 may connect to each channel of comps 32. One or more comps 32 may each connect to a counter of counter 34. Output channels of counter 34 may connect to buffer 36. MUX 39 may connect to counters 34. Ramp generator 37 may receive ramp clock signal 14 and accordingly generate vramp signal 38 by converting a frequency signal to a voltage signal. Ramp generator 37 may be, for example, a switch-capacitor based ramp generator, a current steering digital-to-analogue converter (DAC) based ramp generator, or a charge scaling DAC based ramp generator. The slope of vramp 38 may be determined by the frequency of ramp clock signal 14. In some embodiments with regard to a linear ramp signal, when ramp clock signal 14 increases monotonously in frequency, the slope of vramp 38 increases monotonously. If the frequency of ramp clock signal 14 decreases, the slope of vramp 38 decreases accordingly. In some embodiments with regard to a changing ramp signal, since the ramp clock signal is changing, the ramp signal also changes accordingly.

An exemplary of vramp signal 38 is illustrated below with respect to FIG. 5.

In some embodiments, photodiode array 13 may convert light signals from the environment to voltage signals, such as voltage signals 15. In some embodiments, a strong light condition may cause a high voltage at voltage signals 15.

In some embodiments, comps 32 include a plurality of parallel analog comparators, each receiving a vramp signal 38 from ramp generator 38 and one of voltage signals 15 and comparing the two signals. Each comparator may connect to a corresponding output channel of photodiode array 13 to receive one of voltage signals 15, and may output signals 33 CMP-OUT[1] . . . [n] to a corresponding counter of counters 34. Vramp 38 may be a global input signal for all of the comparators. When vramp 38 ramps from a low voltage to a high voltage, each of comps 32 can compare vramp 38 with a corresponding voltage signal 15. If vramp 38 is larger than any one of PD-SIG[n:1], a corresponding comparator of comps 32 may switch, for example, from high to low.

In some embodiments, the ramping time from vramp 38 starts ramping to each of comps 32 switches may be recorded by a corresponding counter of counters 34. The range of counters 34 may be the bits number of ramp-ADC 12. For example, 10-bits ramp-ADC needs 1023 steps of counter 34.

In some embodiments, MUX 39 may receive EX_CNT_CLK 19 and ramp clock signal 14 and select one of them as an output. EX_CNT_CLK 19 may be an external clock signal with a constant frequency. Processor 111 or system processor 400 may control MUX 39 to select EX_CNT_CLK 19 or ramp clock signal 14 as an output, according to instructions stored in a memory of system 100, such as non-transitory computer-readable storage medium 112. MUX 39 may output CNT_CLK 31 to counters 34 as a clock signal of counter 34 to measure the ramping time.

In some embodiments, buffer 36, receiving outputs 35 CNT-OUTn[0:k] . . . CNT-OUT1[0:k], may be an output buffer of ramp-ADC 12 by coding the k bits of counter output signals 35. Buffer 36 may output data output 16 of image sensor 10.

In some embodiments, two methods can be used to extend the dynamic range of the sensor system, using a constant-frequency or a changing-frequency CNT-CLK 31. With respect to the first method, if MUX 39 selects EX_CNT_CLK 19 with a constant frequency as CNT-CLK 31, LSB can be decreased to obtain an extended dynamic range. In one example of a positive ramp, a shorter ramping time may be caused by a weaker light signal and a lower voltage of voltage signals 15. In a beginning stage of a slope-changing vramp 38, comparing to a conventional linear ramp, the slope of vramp 38 is smaller, which gives a weak signal more ramping time to be registered. Thus, counter 34 may register more ADC codes since CNT-CLK 31 is constant and the ramping time is longer. Since the LSB of ramp-ADC 12 is the delta voltage of vramp 38 in one period of CNT-CLK 31, a smaller slope of vramp 38 can generate a smaller delta voltage of vramp 38 in the same period of CNT-CLK 31, which corresponds to a smaller LSB. Therefore, here at the beginning stage of vramp 38, a smaller LSB can increase the signal-to-noise ratio, and a small light signal can be more accurately captured.

As vramp signal 38 ramps up, the corresponding LSB may also increase. In the case of a stronger light signal corresponding to a later stage of vramp 38, having a larger LSB can preserve the total ramping time and, thus, the total bit numbers and the sensor frame rate. In a strong light condition, signal-to-noise ratio may be less critical, given the stronger signal than that in a weak light condition. At the end point of vramp 38 where the LSB is the largest, the slope of vramp 38 may also be the largest.

As discussed above, in some embodiments, for ramp-ADC 12, DR=FSR/LSB, where DR is dynamic range, FSR is a full scale range, and LSB is a least significant bit. FSR is constant. LSB is smaller in the beginning stage of vramp 38, which can lead to a larger DR and/or an extended ramp-ADC 12 code range in weak light. In the middle stage of vramp 38, LSB increases. In the final stage of vramp 38, LSB becomes larger, and can compress ramp-ADC 12 code in strong light area. That is, in some embodiments, in a beginning session, the generated slope-changing ramp clock signal may have a small slope corresponding to relatively weak light. But toward an end session, the generated slope-changing ramp clock signal may have a large slope corresponding to relatively strong light. Since the total FSR is unchanged and signal capturing from noises is more critical in a weak light condition, the dynamic range image can be extended.

With respect to the second method, if MUX 39 selects ramp clock signal 14 with a changeable frequency as CNT-CLK 31, ramp-ADC bits number or FSR can be extended to increase the dynamic range, for example, from 10 bits to 12 bits. In this example, CNT-CLK 31 and ramp clock signal 14 have identical changing frequencies. As the frequency of ramp clock signal 14 increases, the total counter steps may increase in the same ramping time period. In a weak light area, the speed of CNT-CLK 31 may be lower, which can cause the counter to register more codes and cause image sensor 10 to have a better performance. In a strong light area, the speed of CNT-CLK 31 is higher. The sensor noise may be larger because of a higher counter speed associated with the larger speed of CNT-CLK 31, but the photodiode signal may be strong enough to overcome the effect of the large noise. Since counter clock CNT-CLK 31 and ramp clock signal 14 have the same frequency, the LSB is constant within the whole ramping time period for this extended bit range scenario. An exemplary illustration of the second method can be found below with reference to FIG. 6.

Figure 4:
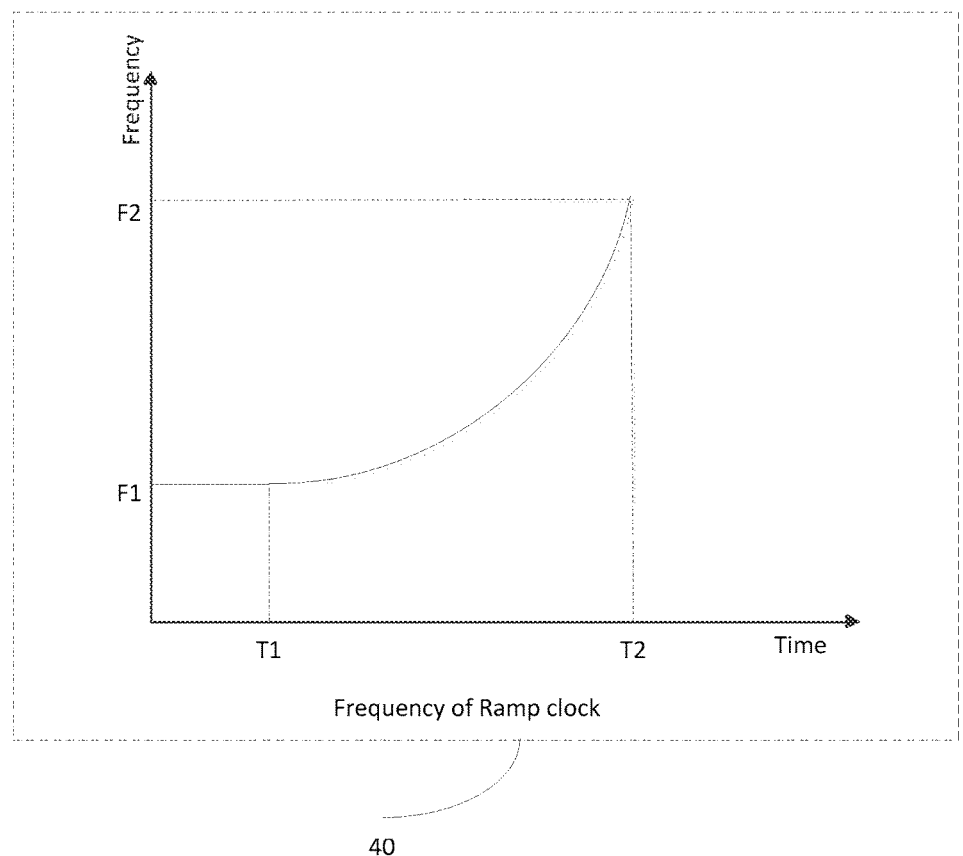
FIG. 4 is a graphical representation illustrating a clock frequency curve, consistent with exemplary embodiments of the present disclosure.

FIG. 4 is a graphical representation 40 illustrating a frequency curve of ramp clock signal 14, consistent with exemplary embodiments of the present disclosure. T1 is a ramp start time. T2 is a ramp end time. The total ramp time is from T1 to T2. F1 is the frequency of ramp clock signal 14 at T1. F2 is the frequency at T2. FIG. 4 is an example of a frequency-accelerated ramp clock, which can be used in the methods described above.

Figure 5:
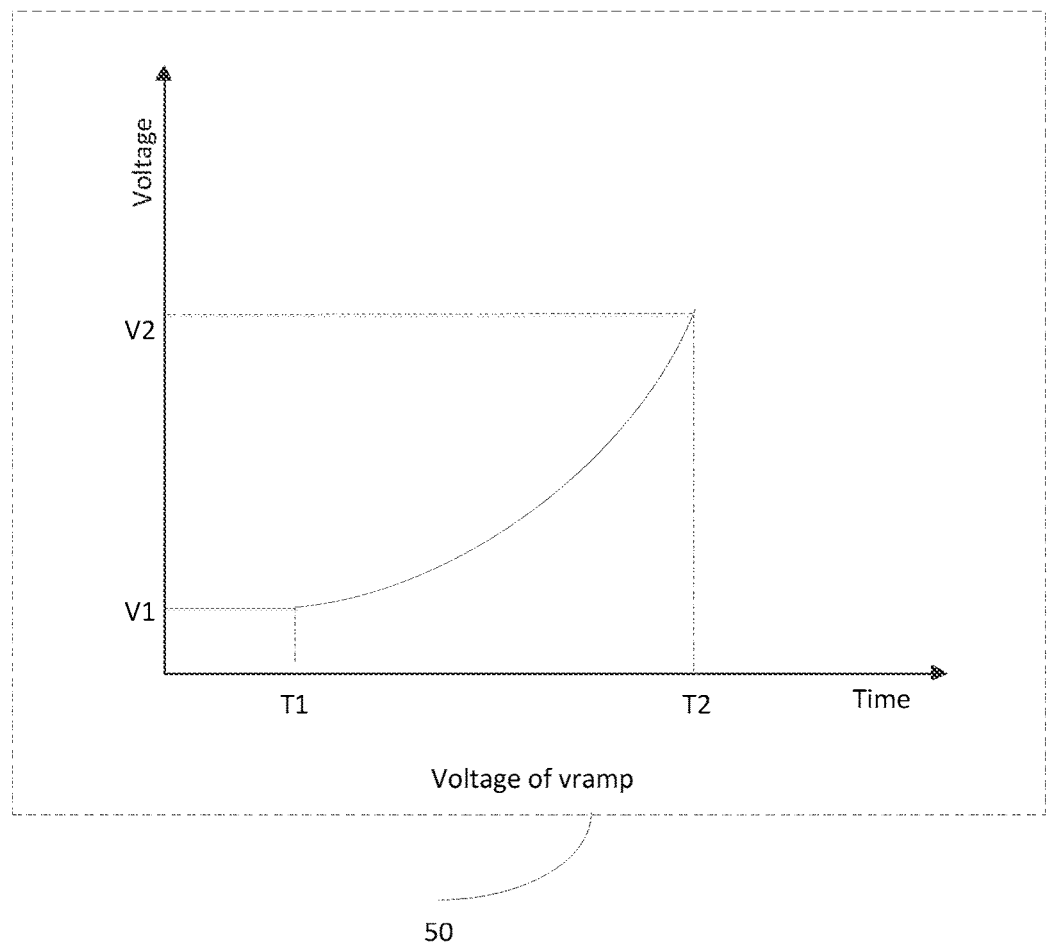
FIG. 5 is a graphical representation illustrating a changing vramp signal curve, consistent with exemplary embodiments of the present disclosure.

FIG. 5 is a graphical representation 50 illustrating a changing vramp voltage signal curve, consistent with exemplary embodiments of the present disclosure. Vramp increases from V1 to V2, while the slope also increases.

Figure 6:
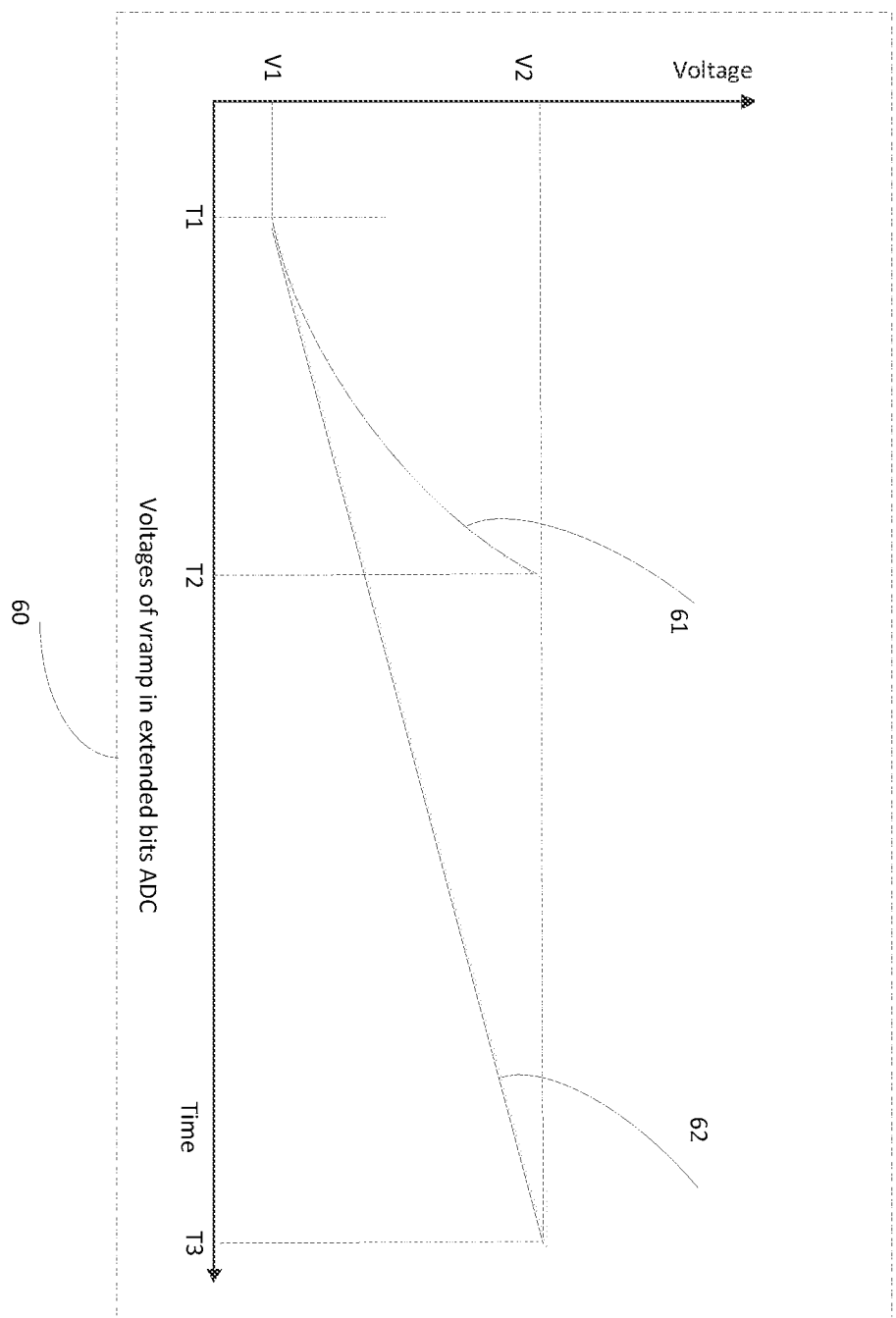
FIG. 6 is a graphical representation illustrating a vramp signal curve in an ADC bits extended case, consistent with exemplary embodiments of the present disclosure.

FIG. 6 is a graphical representation 60 illustrating a vramp signal curve in an ADC bits extended case corresponding to the second method described above, consistent with exemplary embodiments of the present disclosure. Line 61 is an exemplary acceleration ramp with a frequency-increased count clock. Line 62 is an exemplary linear ramp. In the linear ramp case, to extend the ADC bits, the total ramping time is increased from T1 to T3. For example, from 10 bits to 11 bits, (T3-T1) would be two times of (T2-T1); and from 10 bits to 12 bits, (T3-T1) would be four times of (T2-T1). The extra ramping time may limit the frame rate of image sensor 10. As shown in the figure, by applying method 2 described above, the total ramping time can remain unchanged at T1 while extending the ADC bits with the accelerated count clock. Thus, FSR is increased, and since LSB is unchanged, DR can be increased.

As described, the present disclosure includes methods and devices to generate a ramping signal with a changing slope by changing a clock generator frequency, and/or using a fine-step discrete frequency-changing clock. An extended dynamic range image can be achieved with the disclosed methods and/or devices.

The disclosed systems and methods may mitigate or overcome one or more of the problems set forth in the background section and/or other problems in the prior art. The advantages of the disclosed systems, devices, and methods may include, but not limited to, the following:

Clear extended dynamic range pictures: since the disclosed systems, devices, and methods do not need to merge different pictures, there is no picture clarity problem, and all pictures can have extended dynamic ranges.

High speed: the disclosed systems, devices, and methods can realize high frame rate, because for the first method, taking several multi-exposure time pictures is not needed; and for the second method, no extra ramping time is required.

High resolution: since the disclosed systems, devices, and methods can extend the dynamic range data for each pixels, resolution would not become a limitation for the extended dynamic range pictures.

Low cost: comparing to the conventional CMOS Image sensors, disclosed systems, devices, and methods do not need sophisticated software, nor a large size memory.

Application flexibility: the disclosed systems, devices, and methods can be applied in different kinds of image sensors, such as rolling shutter sensors, and global shutter sensors.

A person skilled in the art can further understand that, various exemplary logic blocks, modules, circuits, and algorithm steps described with reference to the disclosure herein may be implemented as specialized electronic hardware, computer software, or a combination of electronic hardware and computer software. For examples, the modules/units may be implemented by one or more processors to cause the one or more processors to become one or more special purpose processors to executing software instructions stored in the computer-readable storage medium to perform the specialized functions of the modules/units.

The flowcharts and block diagrams in the accompanying drawings show system architectures, functions, and operations of possible implementations of the system and method according to multiple embodiments of the present invention. In this regard, each block in the flowchart or block diagram may represent one module, one program segment, or a part of code, where the module, the program segment, or the part of code includes one or more executable instructions used for implementing specified logic functions. It should also be noted that, in some alternative implementations, functions marked in the blocks may also occur in a sequence different from the sequence marked in the drawing. For example, two consecutive blocks actually can be executed in parallel substantially, and sometimes, they can also be executed in reverse order, which depends on the functions involved. Each block in the block diagram and/or flowchart, and a combination of blocks in the block diagram and/or flowchart, may be implemented by a dedicated hardware-based system for executing corresponding functions or operations, or may be implemented by a combination of dedicated hardware and computer instructions.

As will be understood by those skilled in the art, embodiments of the present disclosure may be embodied as a method, a system or a computer program product. Accordingly, embodiments of the present disclosure may take the form of an entirely hardware embodiment, an entirely software embodiment or an embodiment combining software and hardware for allowing specialized components to perform the functions described above. Furthermore, embodiments of the present disclosure may take the form of a computer program product embodied in one or more tangible and/or non-transitory computer-readable storage media containing computer-readable program codes. Common forms of non-transitory computer readable media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Embodiments of the present disclosure are described with reference to flow diagrams and/or block diagrams of methods, devices (systems), and computer program products according to embodiments of the present disclosure. It will be understood that each flow and/or block of the flow diagrams and/or block diagrams, and combinations of flows and/or blocks in the flow diagrams and/or block diagrams, can be implemented by computer program instructions. These computer program instructions may be provided to a processor of a computer, an embedded processor, or other programmable data processing devices to produce a special purpose machine, such that the instructions, which are executed via the processor of the computer or other programmable data processing devices, create a means for implementing the functions specified in one or more flows in the flow diagrams and/or one or more blocks in the block diagrams.

These computer program instructions may also be stored in a computer-readable memory that can direct a computer or other programmable data processing devices to function in a particular manner, such that the instructions stored in the computer-readable memory produce a manufactured product including an instruction means that implements the functions specified in one or more flows in the flow diagrams and/or one or more blocks in the block diagrams.

These computer program instructions may also be loaded onto a computer or other programmable data processing devices to cause a series of operational steps to be performed on the computer or other programmable devices to produce processing implemented by the computer, such that the instructions (which are executed on the computer or other programmable devices) provide steps for implementing the functions specified in one or more flows in the flow diagrams and/or one or more blocks in the block diagrams. In a typical configuration, a computer device includes one or more Central Processing Units (CPUs), an input/output interface, a network interface, and a memory. The memory may include forms of a volatile memory, a random access memory (RAM), and/or non-volatile memory and the like, such as a read-only memory (ROM) or a flash RAM in a computer-readable storage medium. The memory is an example of the computer-readable storage medium.

The computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The computer-readable medium includes non-volatile and volatile media, and removable and non-removable media, wherein information storage can be implemented with any method or technology. Information may be modules of computer-readable instructions, data structures and programs, or other data. Examples of a non-transitory computer-readable medium include but are not limited to a phase-change random access memory (PRAM), a static random access memory (SRAM), a dynamic random access memory (DRAM), other types of random access memories (RAMs), a read-only memory (ROM), an electrically erasable programmable read-only memory (EEPROM), a flash memory or other memory technologies, a compact disc read-only memory (CD-ROM), a digital versatile disc (DVD) or other optical storage, a cassette tape, tape or disk storage or other magnetic storage devices, a cache, a register, or any other non-transmission media that may be used to store information capable of being accessed by a computer device. The computer-readable storage medium is non-transitory, and does not include transitory media, such as modulated data signals and carrier waves.

The specification has described methods, apparatus, and systems for generating a ramp signal with a changing slope. The illustrated steps are set out to explain the exemplary embodiments shown, and it should be anticipated that ongoing technological development will change the manner in which particular functions are performed. Thus, these examples are presented herein for purposes of illustration, and not limitation. For example, steps or processes disclosed herein are not limited to being performed in the order described, but may be performed in any order, and some steps may be omitted, consistent with the disclosed embodiments. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A device for generating a ramp signal with a changing slope, the device comprising:
   a processor configured to generate a variable signal; and
   a phase-locked loop (PLL) circuit configured to:
     receive the variable signal and a reference clock signal,
     generate a changing ramp clock signal based on the variable signal and the reference clock signal, and
     output the generated changing ramp clock signal as an input of an analog-to-digital-converter (ADC) circuit.

2. The device of claim 1, wherein:
   the PLL circuit comprises a charge-pump with a low pass filter (CP-LPF); and
   the CP-LPF is pre-configured to determine a loop bandwidth of the PLL, the loop bandwidth determining a lock time of the PLL.

3. The device of claim 2, wherein the PLL is a fractional PLL including a Sigma-Delta modulator.

4. The device of claim 2, wherein the PLL is an integer PLL.

5. The device of claim 1, wherein the variable signal monotonically increases in value, causing the generated changing ramp clock signal to have a positive rate of increase.

6. The device of claim 5, wherein:
   the PLL circuit and the ADC circuit are components of a sensor; and
   the sensor further comprises a photodiode array.

7. The device of claim 6, wherein the ADC circuit comprises:
   a ramp generator configured to convert the generated changing ramp clock signal to a changing ramp voltage signal;
   one or more comparators each configured to:
     receive the ramp voltage signal and a photodiode signal from a photodiode of the photodiode array,
     compare the ramp voltage signal with the photodiode signal, and
     switch if the ramp voltage signal exceeds the photodiode signal; and
   one or more counters one-to-one corresponding to the one or more parallel comparators and configured to record a time from the ramp voltage signal starts in a cycle to a corresponding comparator switches.

8. The device of claim 7, wherein the ramp generator includes at least one of a switch-capacitor based ramp generator, a current steering DAC based ramp generator, or a charge scaling DAC based ramp generator.

9. The device of claim 7, wherein the one or more counters receive the generated changing ramp clock signal as a clock signal of the one or more counters, causing the ADC circuit to keep a same total ramping time per cycle with an increased bit range of the ADC circuit.

10. The device of claim 7, wherein the one or more counters receive a constant external clock signal as a clock signal of the one or more counters, causing the ADC circuit to extend its dynamic range.

11. The device of claim 7, further comprising a multiplexer (MUX) configured to:
    receive the generated changing ramp clock signal and a constant external clock signal; and
    select one of the generated changing ramp clock signal and the constant external clock signal as a clock signal of the one or more counters.

12. The device of claim 7, wherein:
    the generated changing ramp clock signal is cyclic;
    at a beginning of each cycle corresponding to a first photodiode signal, the generated changing ramp clock signal has a first rate of change;
    at an end of each cycle corresponding to a second photodiode signal, the generated changing ramp clock signal has a second rate of change;
    the second photodiode signal is larger than the first photodiode signal; and
    the second rate of change is larger than the first rate of change.

13. A method for generating a ramp signal with a changing slope, the method comprising:
    generating, by a processor, a variable signal;
    receiving, by a phase-locked loop (PLL) circuit, the variable signal and a reference clock signal;
    generating, by the PLL circuit, a changing ramp clock signal based on the variable signal and the reference clock signal; and
    outputting, by the PLL circuit, the generated changing ramp clock signal as an input of an analog-to-digital-converter (ADC) circuit.

14. The method of claim 13, wherein the PLL circuit comprises a charge-pump with a low pass filter (CP-LPF); and
    further comprising pre-configuring the CP-LPF to determine a loop bandwidth of the PLL, the loop bandwidth determining a lock time of the PLL.

15. The method of claim 14, wherein the PLL is a fractional PLL including a Sigma-Delta modulator.

16. The method of claim 14, wherein the PLL is an integer PLL.

17. The method of claim 13, wherein the variable pattern monotonically increases in value, causing the generated changing ramp clock signal to have a positive rate of increase.

18. The method of claim 17, wherein:
    the PLL circuit and the ADC circuit are components of a sensor; and
    the sensor further comprises a photodiode array.

19. The method of claim 18, further comprising:

converting, by a ramp generator of the ADC circuit, the generated changing ramp clock signal to a changing ramp voltage signal;

receiving, by one or more comparators of the ADC circuit, the ramp voltage signal and a photodiode signal from a photodiode of the photodiode array;

comparing, by the one or more comparators, the ramp voltage signal with the photodiode signal;

switching, by the one or more comparators, if the ramp voltage signal exceeds the photodiode signal; and recording, by one or more counters of the ADC circuit, a time from the ramp voltage signal starts in a cycle to a corresponding comparator switches, the one or more counters one-to-one corresponding to the one or more parallel comparators.

20. The method of claim 19, wherein the ramp generator includes at least one of a switch-capacitor based ramp generator, a current steering DAC based ramp generator, or a charge scaling DAC based ramp generator.

21. The method of claim 19, wherein the one or more counters receive the generated changing ramp clock signal as a clock signal of the one or more counters, causing the ADC circuit to keep the same total ramping time per cycle with an increased bit range of the ADC circuit.

22. The method of claim 19, wherein the one or more counters receive a constant external clock signal as a clock signal of the one or more counters, causing the ADC circuit to extend its dynamic range.

23. The method of claim 19, further comprising:

receiving, by a multiplexer (MUX) of the ADC circuit, the generated changing ramp clock signal and a constant external clock signal; and selecting, by the MUX, one of the generated changing ramp clock signal and the constant external clock signal as a clock signal of the one or more counters.

24. The method of claim 23, wherein:

the generated changing ramp clock signal is cyclic;

at a beginning of each cycle corresponding to a first photodiode signal, the generated changing ramp clock signal has a first rate of change;

at an end of each cycle corresponding to a second photodiode signal, the generated changing ramp clock signal has a second rate of change;

the second photodiode signal is larger than the first photodiode signal; and the second rate of change is larger than the first rate of change.

25. A sensor system for generating a ramp signal with a changing slope, comprising:

a photodiode array configured to convert a light signal to an electric signal;

a phase-locked loop (PLL) circuit configured to:

receive a variable signal and a reference clock signal, and generate a changing ramp clock signal based on the variable signal and the reference clock signal; and an analog-to-digital-converter (ADC) circuit configured to measure the light signal by comparing the generated changing ramp clock signal and the electric signal.

\* \* \* \* \*